(12) United States Patent
Chen et al.

(10) Patent No.: US 11,804,433 B2
(45) Date of Patent: Oct. 31, 2023

(54) SEMICONDUCTOR PACKAGE STRUCTURE AND METHOD FOR FORMING THE SAME

(71) Applicant: TAIWAN SEMICONDUCTOR MANUFACTURING COMPANY LTD., Hsinchu (TW)

(72) Inventors: Yang-Che Chen, Hsin-Chu (TW); Chen-Hua Lin, Yunlin County (TW); Victor Chiang Liang, Hsinchu (TW); Huang-Wen Tseng, Hsinchu County (TW); Chwen-Ming Liu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 112 days.

(21) Appl. No.: 17/351,236

(22) Filed: Jun. 18, 2021

(65) Prior Publication Data

US 2022/0406705 A1   Dec. 22, 2022

(51) Int. Cl.
  *H01L 23/528* (2006.01)
  *H01L 23/31* (2006.01)
  (Continued)

(52) U.S. Cl.
  CPC .......... *H01L 23/528* (2013.01); *H01L 21/486* (2013.01); *H01L 21/56* (2013.01); *H01L 23/31* (2013.01); *H01L 23/5226* (2013.01)

(58) Field of Classification Search
  CPC ......... H01L 24/19; H01L 24/24; H01L 25/82; H01L 23/528; H01L 27/0207; H01L 21/486; H01L 21/56; H01L 23/31; H01L 23/5226; H01L 24/18; H01L 24/82; H01L 23/552; H01L 23/31251; H01L 25/0655; H01L 25/50; H01L 21/6835; H01L 23/3128; H01L 21/4857; H01L 23/5383; H01L 23/49816; H01L 23/5389; H01L 2221/68359; H01L 2221/68331; G02B 6/3582

See application file for complete search history.

(56) References Cited

U.S. PATENT DOCUMENTS 9,000,584 B2   4/2015 Lin et al.
9,048,222 B2   6/2015 Hung et al.
(Continued)

*Primary Examiner* — Galina G Yushina
(74) *Attorney, Agent, or Firm* — WPAT LAW; Anthony King

(57) ABSTRACT

A semiconductor package structure and method of manufacturing a semiconductor package structure are provided. The semiconductor package structure includes a connection layer formed on a metal base layer, at least one die unit formed on the connection layer, a metal pillar connecting the metal base layer and surrounding the die unit, and an interconnect structure overlaid onto the die unit and the metal pillar. Each die unit comprises at least one die attached onto the connection layer and surrounded by a molding structure. The interconnect structure includes a first interconnect layer overlaid onto the die unit and the metal pillar and a second interconnect layer formed on the first interconnect layer. The first and second interconnect layers comprise first and second metal layers being parallel with the top surface of the die unit. A projection of the metal layers overlaps an upper surface of the die.

20 Claims, 23 Drawing Sheets

(51) Int. Cl.
*H01L 21/48* (2006.01)
*H01L 21/56* (2006.01)
*H01L 23/522* (2006.01)

(56) References Cited

U.S. PATENT DOCUMENTS

| | | |
|---|---|---|
| 9,048,233 B2 | 6/2015 | Wu et al. |
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2011/0084292 A1* | 4/2011 | McDaniel, Jr. ............ F21K 9/00 716/132 |
| 2013/0040427 A1* | 2/2013 | Hu ......................... H01L 24/19 257/E21.503 |
| 2016/0260695 A1* | 9/2016 | Chung ................... H01L 25/50 |
| 2019/0006289 A1* | 1/2019 | Huang ................... H01L 24/02 |
| 2019/0348371 A1* | 11/2019 | Fang ...................... H01L 23/552 |
| 2021/0098391 A1* | 4/2021 | Wu ..................... H01L 23/5386 |

\* cited by examiner

SEMICONDUCTOR PACKAGE STRUCTURE AND METHOD FOR FORMING THE SAME

BACKGROUND

The semiconductor industry has experienced rapid growth, due in part to ongoing improvements in the integration density of a variety of electronic components (e.g., transistors, diodes, resistors, capacitors, etc.). For the most part, improvements in integration density have resulted from iterative reduction of minimum feature size, which allows more components to be integrated into a given area. As the demand for smaller electronic devices has increased, a need for more space-efficient and creative packaging techniques for semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
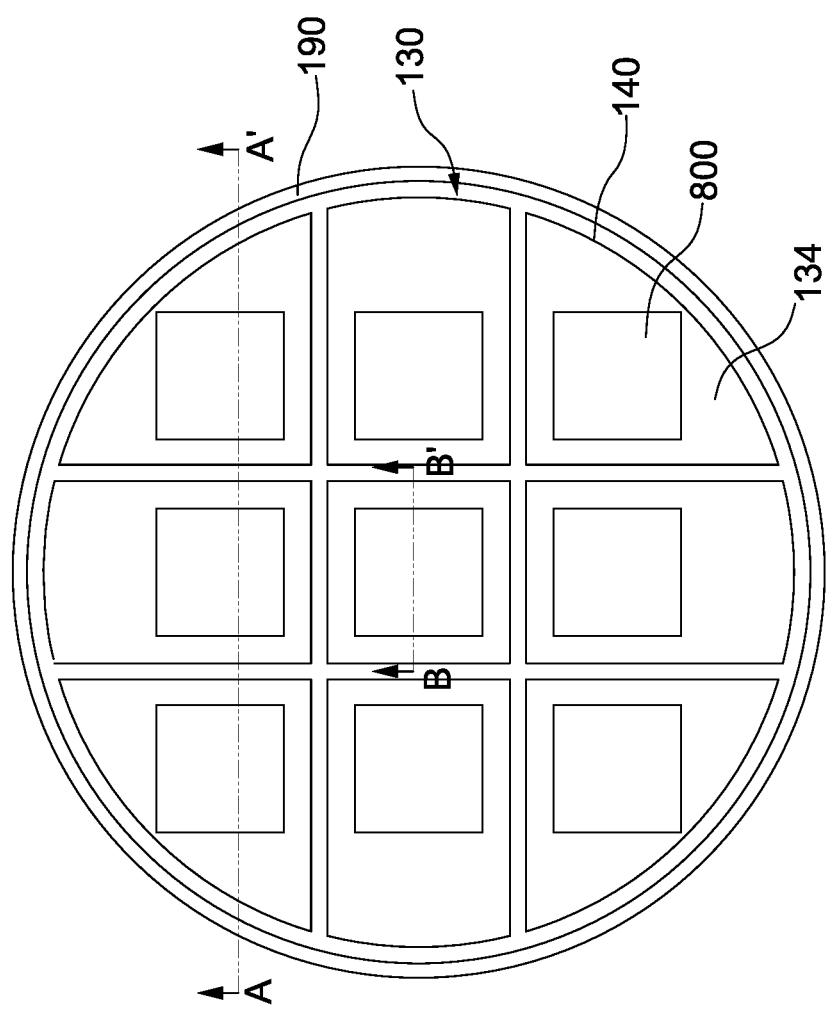
FIG. 1 is a cross-sectional top view illustrating a semiconductor package structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure, Relative terms, such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected" refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features; rather, the scope of the disclosure shall be defined by the claims appended hereto.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Other features and processes may also be included. For example, testing structures may be included to aid in the verification testing of 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

For a semiconductor package (i.e., system on package (SiP) including systems packaged by the integrated fan-out (InFO) technology, such as system on wafer (SoW), InFO on substrate (InFO-oS), and so on), an electromagnetic interference (EMI) shielding is needed with the operation frequency increasing (e.g., 5G and more RF chips integrated in compacted. SiP). An electromagnetic interference (EMI) shielding effects may be provided by forming one or more conductive shielding structure to cover each chip/die from radiation generated by other components (such as other semiconductor devices). In general, a package substrate with a silicon chip/die can be attached to a printed circuit board (PCB) through a ball grid array (BGA) or the like. A conductive shielding structure is a metal lid attached to a printed circuit board (PCB) through electrically conductive adhesive, so that the package substrate is located between the conductive shielding structure and the PCB. It is required to keep a certain distance from the conductive shielding structure to the package substrate and also keep a certain distance from one conductive shielding structure covering one chip to another covering another chip, so such area penalty may hinder the size reduction on semiconductors. Furthermore, to form such external conductive shielding lid, an extra procedure is required, which increases cost for manufacturing the semiconductor package. In addition, the conductive adhesive has resistivity that is about two orders of magnitude higher than the metal lid and the use of the conductive adhesive may results in insufficient EMI shielding effects.

The present disclosure therefore provides a semiconductor package structure including an internal EMI shielding structure and a method for forming the same.

Figure 2:
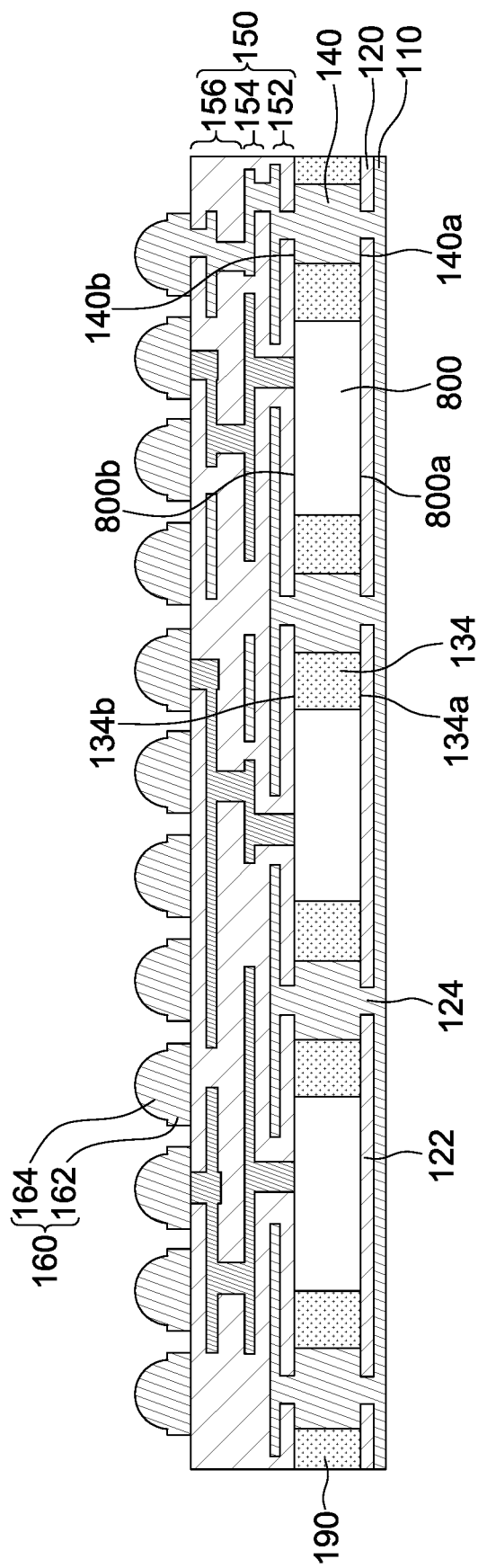
FIG. 2 is a cross-sectional side view illustrating a semiconductor package structure taken along line A-A' of FIG. 1 in accordance with some embodiments of the present disclosure.
Figure 3:
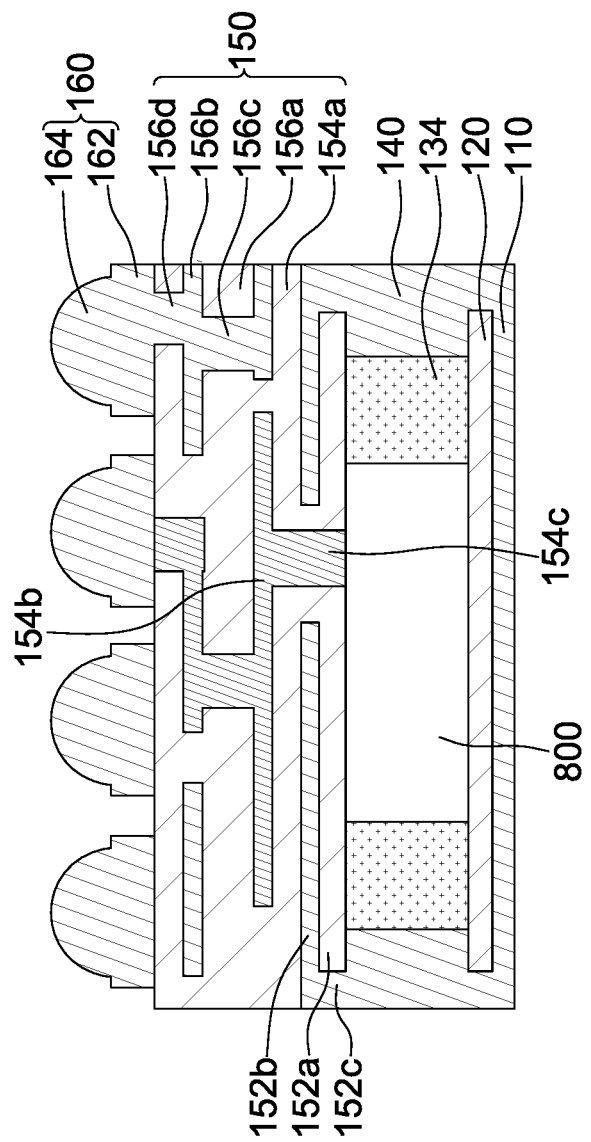
FIG. 3 is a cross-sectional side view illustrating a semiconductor package structure taken along line B-B' of FIG. 1 in accordance with some embodiments of the present disclosure.

FIG. 1 is a cross-sectional top view illustrating a semiconductor package structure in accordance with some embodiments of the present disclosure. FIGS. 2 and 3 are cross-sectional side views illustrating a semiconductor package structure taken along line A-A' and line B-B' of FIG. 1, respectively, in accordance with some embodiments of the present disclosure. As shown in FIGS. 1 to 3, the semiconductor package structure 10 comprises a metal base layer 110, a connection layer 120 formed on the metal base layer 110, at least one die unit 130 formed on the connection layer 120, a metal pillar 140 connecting the metal base layer 110 and surrounding the die unit 130, an outer molding structure 190, an interconnect structure 150 formed on the die unit 130 and the metal pillar 140, and a plurality of external connectors 160 connecting the interconnect structure 150.

The metal base layer 110 may be a continuous or discontinuous layer. For example, the metal base layer 110 may include a plurality of segments separated by insulating materials (not shown). In some embodiments, the metal base layer 110 includes one or more conductive materials, such as tungsten (W), aluminum (Al), copper (Cu), gold (Au), silver (Ag), or platinum (Pt), but the disclosure is not limited thereto.

The connection layer 120 is overlaid onto the metal base layer 110 and may comprise a plurality of dielectric layers 122 and a plurality of connecting vias 124. The dielectric layers 122 are formed on the metal base layer 110 and may include a polymer, such as polybenzoxazole (PBO), polyimide, benzocyclobutene (BCB) or the like. In other embodiments, the dielectric layer 122 may include silicon nitride, silicon oxide, phosphosilicate glass (PSG), borosilicate glass (BSG), boron-doped phosphsilicate glass (BPSG), or the like. The connecting vias 124 are formed in the connection layer 120 and separate the plurality of dielectric layers 122 from each other. The connecting vias 124 may include the same conductive materials as those for the metal base layer 110, such as tungsten (W), aluminum (Al), copper (Cu), gold (Au), silver (Ag), or platinum (Pt), but the disclosure is not limited thereto.

The die unit 130 is formed on the dielectric layer 122 of the connection layer 120. Each die unit 130 comprises at least one die 800 and a molding structure 134. The die 800 can be attached onto dielectric layer 122 of the connection layer 120 and may comprise a first die surface 800a (i.e., the lower surface of the die 800) and a second die surface 800b (i.e., the upper surface of the die 800). The first die surface 800a abuts the dielectric layer 122 of the connection layer 120. The second die surface 800b is opposite to the first die surface 800a. In some embodiments, the die 800 may include an integrated circuit (IC) die. The IC die may be a logic die (e.g., a central processing unit (CPU) die or chip, a microcontroller die, etc.), a memory die (e.g., a dynamic random access memory (DRAM) die, a static random access memory (SRAM) die, etc.), a power management die (e.g., a power management integrated circuit (PMC) die), a radio frequency (RF) die, a sensor die, a micro-electro-mechanical-system (MEMS) die, a signal processing die (e.g., a digital signal processing (DSP) die), a front-end die (e.g., an analog front-end (AFE) die), a bio chip, an energy harvesting chip, the like, or a combination thereof. In some embodiments, the die 800 may include passive devices. In such embodiments, the die 800 may be a zero-inductance integrated passive device (ZLIPD) die, but the disclosure is not limited thereto. As shown in FIG. 1, the semiconductor package structure comprises nine die units 130 and each die unit comprises one die 800.

In some embodiments, each die unit 130 includes a molding structure 134 formed on the dielectric layer 122 of the connection layer 120 and surround the die 800, so that the molding structure 134 abuts the sidewall of the die 800. The molding structure 134 has a first molding surface 134a and a second molding surface 134b opposite to the first molding surface 134a. The first molding surface 134a abuts the dielectric layer 122 of the connection layer 120 and is substantially aligned with (i.e., coplanar with) the first die surface 800a. Further, the second molding surface 134b is substantially aligned with (i.e., coplanar with) the second die surface 800b, as shown in FIGS. 2 and 3. Additionally, a thickness of the die 800 is substantially same as a thickness of the molding structure 134. In some embodiments, the molding structure 134 may include resins, such as epoxy, but the disclosure is not limited thereto. In some embodiments, the molding structure 134 may include one or more catalysts to accelerate curing of the resins. In some embodiments, the molding structure 134 may include other materials, such as flame retardants, adhesion promoters, ion traps, and/or stress relievers.

The metal pillar 140 surrounds portions of the molding structure 134 of the die unit 130 and connects the metal base layer 110 through the connecting via 124. The metal pillar 140 abuts an outer sidewall of the molding structure and comprises a first pillar surface 140a and a second pillar surface 140b opposite to the first pillar surface 140a. The first pillar surface 140a of the metal pillar 140 may be substantially aligned with (i.e., coplanar with) the first die surface 800a and the first molding surface 134a. The first pillar surface 140a connects the connecting via 124 and thus is electrically coupled to the metal base layer 110. Further, the second pillar surface 140b may be substantially aligned with (i.e., coplanar with) the second die surface 800b and the second molding surface 134b, as shown in FIGS. 2 and 3. Additionally, a thickness of the metal pillar 140 is substantially same as the thickness of the molding structure 134 and is substantially same as the thickness of the die 800. The metal pillar 140 may include the same conductive materials as those for the metal base layer 110 or the connecting vias 124, such as tungsten (W), aluminum (Al), copper (Cu), gold (Au), silver (Ag), or platinum (Pt), but the disclosure is not limited thereto.

The outer molding structure 190 surrounds the die units 130 along with the metal pillar 140 and thus serves as the sidewall of the semiconductor package structure. Additionally, a thickness of the outer molding structure 190 is substantially same as the thickness of the die 800 and is substantially same as the thickness of the metal pillar 140. The outer molding structure 190 may include resins, such as epoxy, but the disclosure is not limited thereto. In some embodiments, the outer molding structure 190 may include one or more catalysts to accelerate curing of the resins. In some embodiments, the outer molding structure 190 may include other materials, such as flame retardants, adhesion promoters, ion traps, and/or stress relievers. In some embodiments, the molding structure 134 and the outer molding structure 190 include same material.

The interconnect structure 150 is overlaid on the die unit 130 and the metal pillar 140 and comprises a first interconnect layer 152, a second interconnect layer 154 and at least one overlying interconnect layer 156.

The first interconnect layer 152 can be formed on the second die surface 800b of the die 800, the second molding surface 134b of the molding structure 134 and the second pillar surface 140b of the metal pillar 140. The first interconnect layer 152 comprises a first dielectric layer 152a, at least one first metal layer 152b and at least one first metal connection 152c. The first dielectric layer 152a is overlaid onto the die unit 130 and the metal pillar 140. The first metal layer 152b can be formed in the first dielectric layer 152a and may be parallel with the top surface of the die unit 130, including the second die surface 800b of the die 130 and the second molding surface 134b of the molding structure 134. The first metal connection 152c may connect the first metal layer 152b with the metal pillar 140, as shown in FIGS. 2 and 3. In some embodiments, the first metal connection 152c may connect the first metal layer 152b with the die 800 in the die unit 130. In some embodiments, some of the first metal connections 152c connect some first metal layers 152b with the metal pillar 140 and some of the first metal connections 152c connect the other with the dies 800 in the die units 130.

The second interconnect layer 154 can stack on the first interconnect layer 152 and comprises a second dielectric layer 154a, at least one second metal layer 154b and at least one second metal connection 154c. The second dielectric layer 154a is overlaid onto the first interconnect layer 152. The second metal layer 154b is formed in the second dielectric layer 154a and is parallel with the top surface of the die unit 130, including the second die surface 800b of the die 800 and the second molding surface 134b of the molding structure 134. The second metal connection 154c may connect the second metal layer 154b with a die 800 in the die unit 130, as shown in FIGS. 2 and 3. In some embodiments, the second metal connection 154c may connect the second metal layer 154b with the metal pillar 140. In some embodiments, some of the second metal connections 154c connect some second metal layers 154b with the metal pillar 140, some of the second metal connections 154c connect the other with the dies 800 in the die units 130 and/or some of the second metal connections 154c connect some second metal layers 154b with the first metal layers 152b.

The overlying interconnect layer 156 may stack on the second interconnect layer 154 and comprises an overlying dielectric layer 156a, at least one overlying metal layer 156b and overlying metal connections 156c and 156d. The overlying dielectric layer 156a is overlaid onto the second interconnect layer 154. The overlying metal layer 156b is formed in the overlying dielectric layer 156a and is parallel with the top surface of the die unit 130, including the second die surface 800b of the die 800 and the second molding surface 134b of the molding structure 134, The overlying metal connections 156c can connect the overlying metal layer 156b with the first metal connection 152c, the second metal connection 154c or both of the first metal connection 152c and the second metal connection 154c. The overlying metal connections 156d can connect the overlying metal layer 156b with and the external connectors 160.

Each of the first metal layer 152b, the first metal connections 152e, the second metal layer 154b, the second metal connection 154c, the overlying metal layer 156b and the overlying metal connection 156c includes the same conductive materials as those for the metal base layer 110, the connecting vias 124 or the metal pillar 140, such as tungsten (W), aluminum (Al), copper (Cu), gold (Au), silver (Ag), or platinum (Pt), but the disclosure is not limited thereto.

In some embodiments, a projection of the first metal layer 152b and the second metal layer 154b overlaps the top surface of the die unit 130, so that the first and second metal layers 152b and 154b, the metal pillar 140 and the metal base layer 110 surround the die 800 in each die unit 130 and could serve as an EMI shielding. In some embodiments, a projection of the first metal layer 152b overlaps at least a half of the top surface of the die unit 130. In some embodiments, the first metal layer 152b has a projection overlapping the second die surface 800b of the die by about 50% or more. In some embodiments, the second metal layer 154b has a projection overlapping the second die surface 800b of the die by about 50% or more.

The external connectors 160 connect the overlying metal layer 156b of the interconnect structure 150 through the overlying metal connections 156d. The external connectors 160 are disposed over the interconnect structure 150. In some embodiments, the external connectors 160 are disposed on an exterior side of the interconnect structure 150. In some embodiments, the external connector 160 may include a pad 162 and a conductive connector 164. In some embodiments, the pad 162 may be referred to as an under bump metallurgy (UBM). In some embodiments, the pads 162 may include conductive material, such as Cu, Ti, W, Al or the like. In some embodiments, the conductive connector 164 may be a BGA connector, a solder ball, a metal pillar, a controlled collapse chip connection (C4) bump, a micro bump, electroless nickel-electroless palladium-immersion gold technique (ENEPIG) formed bump, or the like. In some embodiments, the conductive connectors 164 may include conductive material, such as solder, Cu, Au, Ag, nickel (Ni), palladium (Pd), tin (Sn), or the like.

Figure 4:
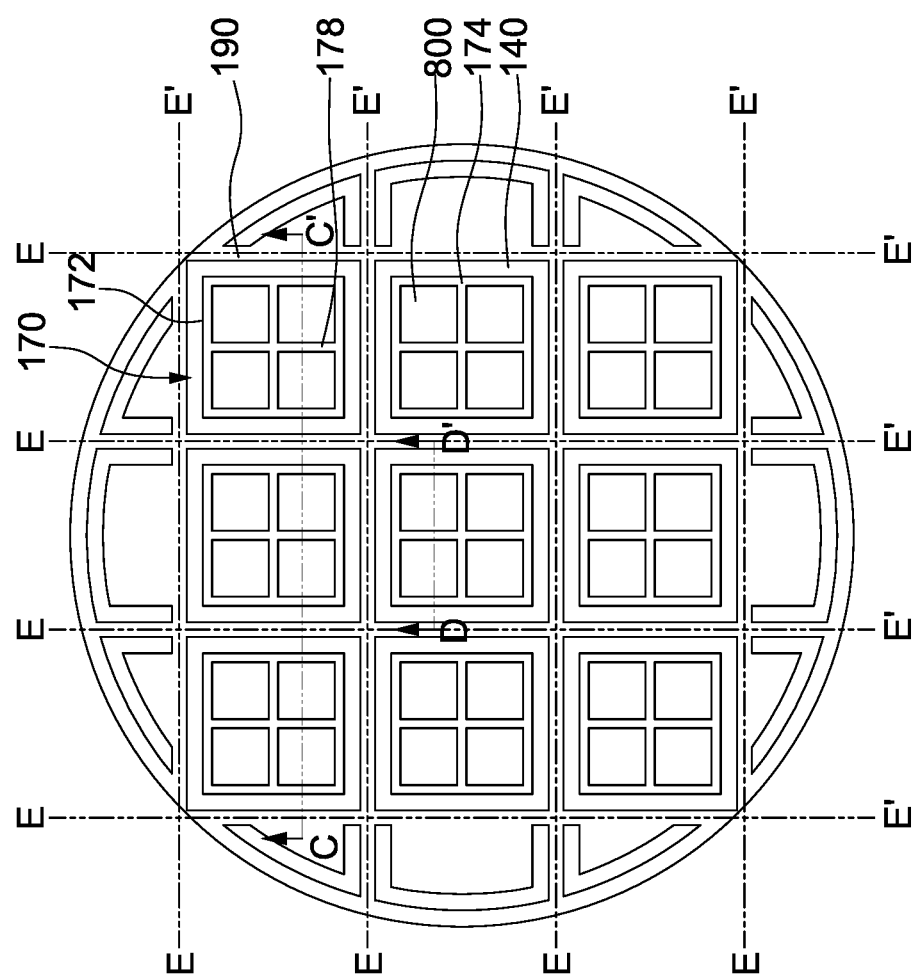
FIG. 4 is a cross-sectional top view illustrating a semiconductor package structure in accordance with some another embodiments of the present disclosure.
Figure 5:
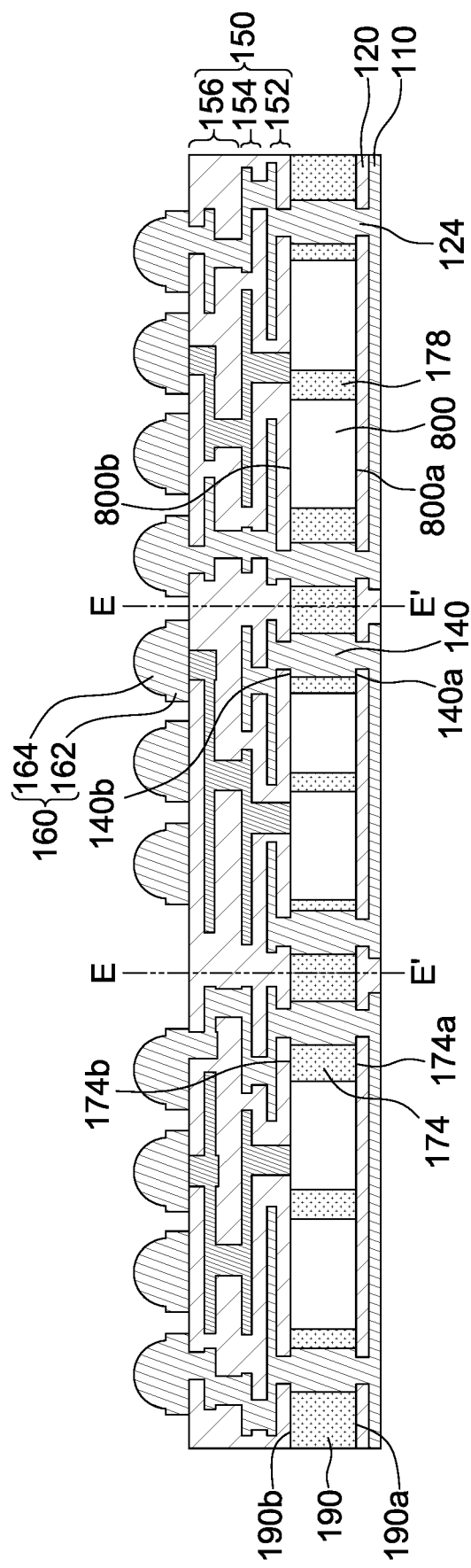
FIG. 5 is a cross-sectional side view illustrating a semiconductor package structure taken along line C-C' of FIG. 4 in accordance with some another embodiments of the present disclosure.
Figure 6:
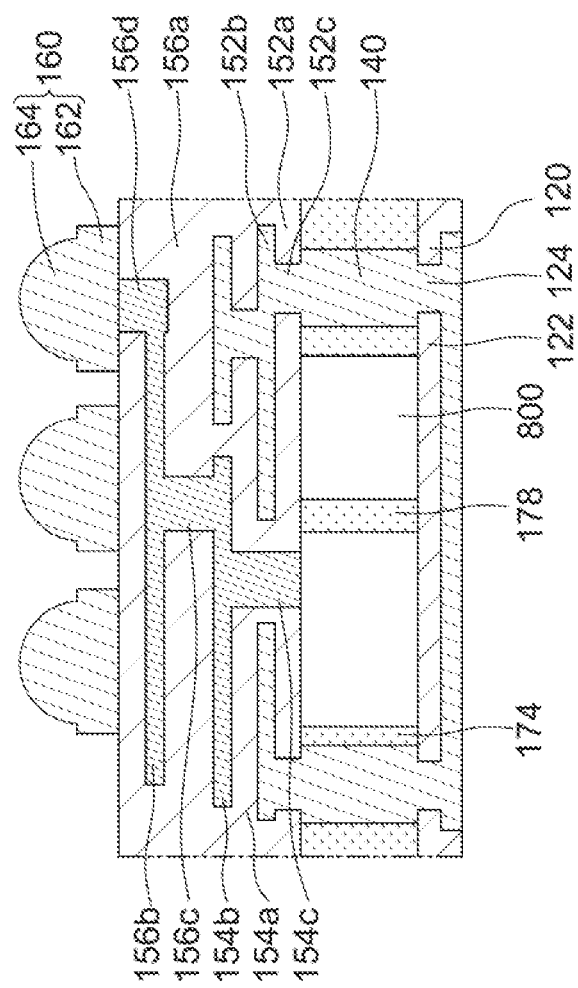
FIG. 6 is a cross-sectional side view illustrating a semiconductor package structure taken along line D-D' of FIG. 4 in accordance with some another embodiments of the present disclosure.

FIG. 4 is a cross-sectional top view illustrating a semiconductor package structure in accordance with some another embodiments of the present disclosure. FIGS. 5 and 6 are cross-sectional side views illustrating a semiconductor package structure taken along line C-C' and line D-D' of FIG. 4, respectively, in accordance with some embodiments of the present disclosure. As shown in FIGS. 4 to 6, the semiconductor package structure comprises a metal base layer 110, a connection layer 120 formed on the metal base layer 110, at least one die unit disposed on the connection layer 120, a metal pillar 140 surrounding the die unit, an outer molding structure 140, an interconnect structure 150 and a plurality of external connectors 160 connecting the interconnect structure 150.

The metal base layer 110 may be a continuous or discontinuous layer. For example, the metal base layer 110 may include a plurality of segments separated by insulating materials (not shown). In some embodiments, the metal base layer 110 includes one or more conductive materials, such as tungsten (W), aluminum (Al), copper (Cu), gold (Au), silver (Ag), or platinum (Pt), but the disclosure is not limited thereto.

The connection layer 120 is overlaid onto the metal base layer 110 and may comprise a plurality of dielectric layers 122 and a plurality of connecting vias 124. The dielectric layers 122 are formed on the metal base layer 110 and may include a polymer, such as polybenzoxazole (PBO), polyimide, benzocyclobutene (BCB) or the like. In other embodiments, the dielectric layer 122 may include silicon nitride, silicon oxide, phosphosilicate glass (PSG), borosilicate glass (BSG), boron-doped phosphsilicate glass (BPSG), or the like. The connecting vias 124 are formed in the connection layer 120 and separate the plurality of dielectric layers 122. The connecting vias 124 may include the same conductive materials as those for the metal base layer 110, such as tungsten (W), aluminum (Al), copper (Cu), gold (Au), silver (Ag), or platinum (Pt), but the disclosure is not limited thereto.

The die unit may include a plurality of dies 800. Further, the dies 800 may be arranged to form a die array 170. The die array 170 is disposed on the connection layer 120 and comprises a plurality of compartments 172 and an inner molding structure 174. The compartments 172 are disposed on the connection layer 120 and are separated by insulating structures 178. Each compartment 172 accommodates a die 800. As shown in FIGS. 4 to 6, each die array 170 comprises four compartments 172 arranged in an array with two rows and each row has two columns, so that the insulating structure 178 has a cross-sectional top view.

The die 800 is located in the compartment 172 and is disposed on the connection layer 120. The die 800 can be attached onto the dielectric layer 122 of the connection layer 120 and may comprise a first die surface 800a and a second die surface 800b. The first die surface 800a abuts the dielectric layer 122 of the connection layer 120. The second die surface 800b is opposite to the first die surface 800a. In some embodiments, the die 800 may include an integrated circuit (IC) die. The IC die may be a logic die (e.g., a central processing unit (CPU) die or chip, a microcontroller die, etc.), a memory die (e.g., a dynamic random access memory (DRAM) die, a static random access memory (SRAM) die, etc.), a power management die (e.g., a power management integrated circuit (PMIC) die), a radio frequency (RF) die, a sensor die, a micro-electro-mechanical-system (MEMS) die, a signal processing die (e.g., a digital signal processing (DSP) die), a front-end die (e.g., an analog front-end (AFE) die), a bio chip, an energy harvesting chip, the like, or a combination thereof. In some embodiments, the die 800 may include passive devices. In such embodiments, the die 800 may be a zero-inductance integrated passive device (ZLIPD) die, but the disclosure is not limited thereto.

The inner molding structure 174 is disposed on the connection layer 120, serve as a sidewall of the die array 170 and thus defines the breadth of the die array 170. The inner molding structure 174 connects the insulating structures 178 separating these compartments 172. In some embodiments, the inner molding structure 174 and the insulating structure 178 together form a grid pattern, as shown in FIG. 4. The inner molding structure 174 has a first molding surface 174a and a second molding surface 174b opposite to the first molding surface 174a. The first molding surface 174a abuts the dielectric layer 122 of the connection layer 120 and is substantially aligned with (i.e., coplanar with) the first die surface 800a. Further, the second molding surface 174b is substantially aligned with (i.e., coplanar with) the second die surface 800b, as shown in FIGS. 5 and 6. Additionally, a thickness of the die 800 is substantially same as a thickness of the inner molding structure 174. In some embodiments, the inner molding structure 174 may include resins, such as epoxy, but the disclosure is not limited thereto. In some embodiments, the inner molding structure 174 may include one or more catalysts to accelerate curing of the resins. In some embodiments, the inner molding structure 174 may include other materials, such as flame retardants, adhesion promoters, ion traps, and/or stress relievers. In some embodiments, the insulating structure 178 may include a material same with the inner molding structure 174.

The metal pillar 140 is disposed on the connection layer 120 and surrounds the inner molding structure 174. The metal pillar 140 connects the metal base layer 110 through the connecting via 124. The metal pillar 140 abuts an outer sidewall of the inner molding structure 174 and comprises a first pillar surface 140a and a second pillar surface 140b opposite to the first pillar surface 140a. The first pillar surface 140a of the metal pillar 140 may be substantially aligned with (i.e., coplanar with) the first die surface 800a and the first molding surface 174a. The first pillar surface 140a connects the connecting via 124 and thus is electrically coupled to the metal base layer 110. Further, the second pillar surface 140b may be substantially aligned with (i.e., coplanar with) the second die surface 800b and the second molding surface 174b, as shown in FIGS. 5 and 6. Additionally, a thickness of the metal pillar 140 is substantially same as the thickness of the inner molding structure 174 and is substantially same as the thickness of the die 800. The metal pillar 140 may include the same conductive materials as those for the metal base layer 110 or the connecting vias 124, such as tungsten (W), aluminum (Al), copper (Cu), gold (Au), silver (Ag), or platinum (Pt), but the disclosure is not limited thereto.

The outer molding structure 190 surrounds the metal pillar 140 and thus can separate the die units 130 from each other. The outer molding structure 190 comprises an outer molding bottom 190a and an outer molding top 190b opposite to the outer molding bottom 190a. The outer molding bottom 190a may be substantially aligned with (i.e., coplanar with) the first die surface 800a, the first molding surface 174a and the first pillar surface 140a. Further, the outer molding top 190b may be substantially aligned with (i.e., coplanar with) the second die surface 800b, the second molding surface 174b and the second pillar surface 140b, as shown in FIGS. 5 and 6. Additionally, a thickness of the outer molding structure 190 is substantially same as the thickness of the inner molding structure 174, is substantially same as the thickness of the die 800 and is substantially same as the thickness of the metal pillar 140. The outer molding structure 190 may include resins, such as epoxy, but the disclosure is not limited thereto. In some embodiments, the outer molding structure 190 may include one or more catalysts to accelerate curing of the resins. In some embodiments, the outer molding structure 190 may include other materials, such as flame retardants, adhesion promoters, ion traps, and/or stress relievers. In some embodiments, the inner molding structure 174, the insulating structure 178 and the outer molding structure 190 include same material.

The interconnect structure 150 is overlaid on the die units 130, the metal pillar 140, the inner molding sttructure 174, the insulating structure 178 and the outer molding structure 190. The interconnect structure 150 comprises a first interconnect layer 152, a second interconnect layer 154 and at least one overlying interconnect layer 156.

The first interconnect layer 152 can be formed on the second die surface 800b of the die 800, the second molding surface 174b of the inner molding structure 174, the second pillar surface 140b of the metal pillar 140 and the outer molding top 190b of the outer molding structure 190. The first interconnect layer 152 comprises a first dielectric layer 152a, at least one first metal layer 152b and at least one first metal connection 152c. The first dielectric layer 152a is overlaid onto the die array 170, the metal pillar 140 and the outer molding structure 190, including the second die surface 800b of the die 800, the second molding surface 174b of the inner molding structure 174, the second pillar surface 140b of the metal pillar 140 and the outer molding top 190b of the outer molding structure 190. The first metal layer 152b can be formed in the first dielectric layer 152a and may be parallel with the second die surface 800b, the second molding surface 174b, the second pillar surface 140b and the outer molding top 190b. The first metal connection 152c may connect the first metal layer 152b with the metal pillar 140, as shown in FIGS. 5 and 6. In some embodiments, the first metal connection 152c may connect the first metal layer 152b with the die 800. In some embodiments, some of the first metal connections 152c connect some first metal layers 152b with the metal pillar 140 and some of the first metal connections 152c connect the other first metal layers 152b with the dies 800.

The second interconnect layer 154 can stack on the first interconnect layer 152 and comprises a second dielectric layer 154a, at least one second metal layer 154b and at least one second metal connection 154c. The second dielectric layer 154a is overlaid onto the first interconnect layer 152. The second metal layer 154b is formed in the second dielectric layer 154a and is parallel with the second die surface 800b, the second molding surface 174b, the second pillar surface 140b and the outer molding top 190b. The second metal connection 154c may connect the second metal layer 154b with a die 800, as shown in FIGS. 5 and 6. In some embodiments, the second metal connection 154c may connect the second metal layer 154b with the metal pillar 140. In some embodiments, some of the second metal connections 154c connect some second metal layers 154b with the metal pillar 140, some of the second metal connections 154c connect some second metal layers 154b with the dies 800 and/or some of the second metal connections 154c connect some second metal layers 154b with the first metal layers 152b.

The overlying interconnect layer 156 may stack on the second interconnect layer 154 and comprises an overlying dielectric layer 156a, at least one overlying metal layer 156b and overlying metal connections 156c and 156d. The overlying dielectric layer 156a is overlaid onto the second interconnect layer 154. The overlying metal layer 156b is formed in the overlying dielectric layer 156a and is parallel with the second die surface 800b, the second molding surface 174b, the second pillar surface 140b and the outer molding top 190b. The overlying metal connections 156c can connect the overlying metal layer 156b with the first metal layer 152b, the second metal layer 154b or both of the first metal layer 152b and the second metal layer 154b. The overlying metal connections 156d can connect the overlying metal layer 156b with the external connectors 160.

Each of the first metal layer 152b, the first metal connections 152c, the second metal layer 154b, the second metal connection 154c, the overlying metal layer 156b and the overlying metal connection 156c includes the same conductive materials as those for the metal base layer 110, the connecting vias 124 or the metal pillar 140, such as tungsten (W), aluminum (Al), copper (Cu), gold (Au), silver (Ag), or platinum (Pt), but the disclosure is not limited thereto.

In some embodiments, a projection of the first metal layer 152b and the second metal layer 154b overlaps the second die surface 800b of the die unit 800, so that the first and second metal layers 152b and 154b, the metal pillar 140 and the metal base layer 110 surround the die 800 in die array 170 and could serve as an EMI shielding. In some embodiments, the first metal layer 152b has a projection overlapping the second die surface 800b of the die 800 by about 50% or more. In some embodiments, the second metal layer 154b has a projection overlapping the second die surface 800b of the die 800 by about 50% or more.

The external connectors 160 connect the overlying metal layer 156b of the interconnect structure 150 through the overlying metal connections 156d. The external connectors 160 are disposed over the interconnect structure 150. In some embodiments, the external connectors 160 are disposed on an exterior side of the interconnect structure 150. In some embodiments, the external connector 160 may include a pad 162 and a conductive connector 164. In some embodiments, the pad 162 may be referred to as an under bump metallurgy (UBM). In some embodiments, the pads 162 may include conductive material, such as Cu, Ti, W, Al or the like. In some embodiments, the conductive connector 164 may be a BGA connector, a solder ball, a metal pillar, a controlled collapse chip connection (C4) bump, a micro bump, electroless nickel-electroless palladium-immersion gold technique (ENEPIG) formed bump, or the like. In some embodiments, the conductive connectors 164 may include conductive material, such as solder, Cu, Au, Ag, nickel (Ni), palladium (Pd), tin (Sn), or the like.

Figure 7:
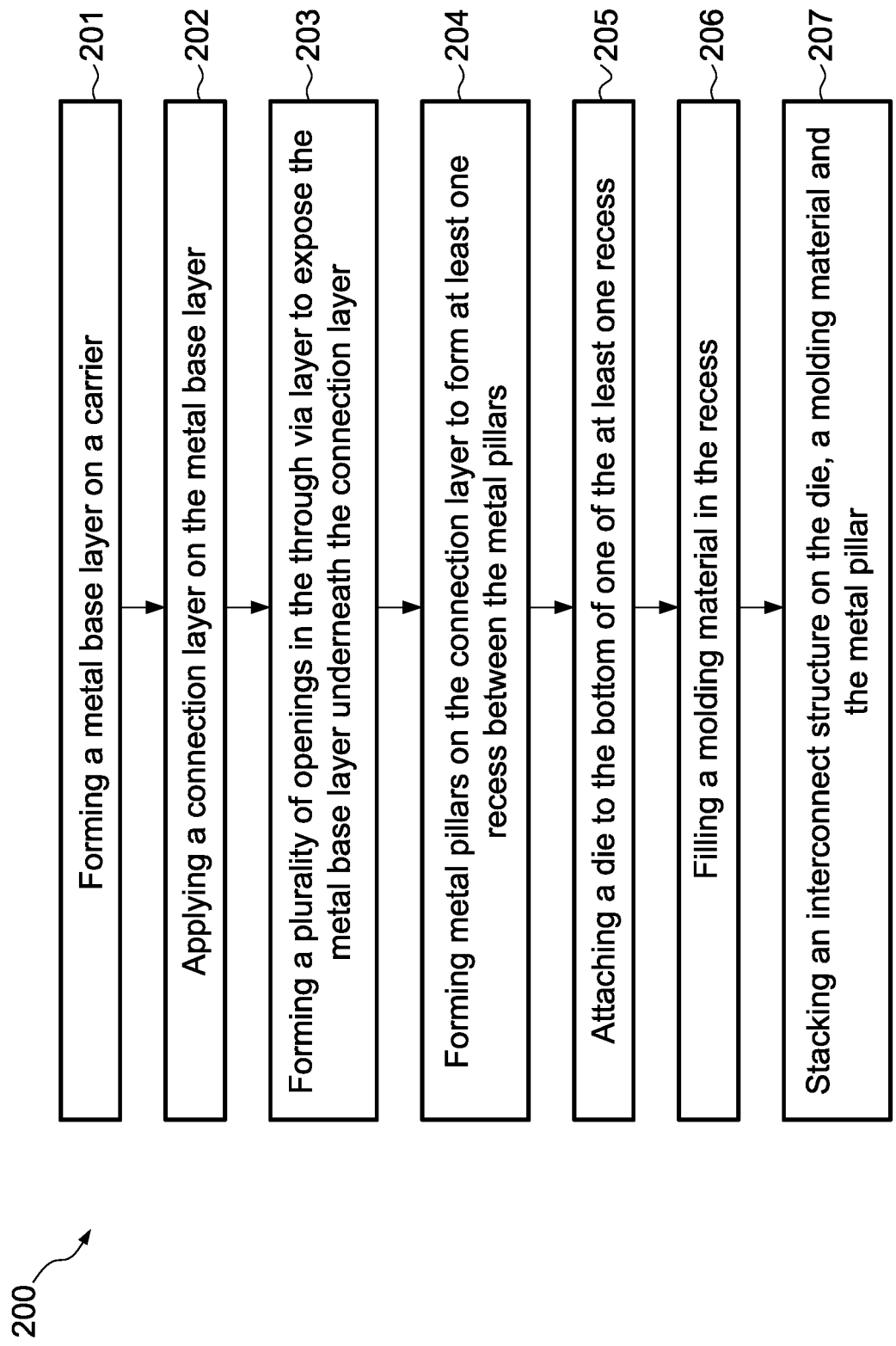
FIG. 7 is a flow diagram of a method of manufacturing a semiconductor package structure in accordance with some embodiments of the present disclosure.

FIG. 7 is a flowchart representing a method for forming a semiconductor package structure according to aspects of the present disclosure, and FIGS. 8A to 8H and 9A to 9H are schematic drawings illustrating stages of the method for forming the semiconductor package structure according to various aspects of the present disclosure. It should be noted that same elements in FIGS. 1 to 3 and 8A to 8H may include same materials and are indicated by the same numerals and FIGS. 4 to 6 and 9A to 9H may include same materials and are indicated by the same numerals; therefore, repeated descriptions are omitted for brevity. The method 200 includes a number of operations (201, 202, 203, 204, 205, 206 and 207). The method 200 will be further described according to one or more embodiments. It should be noted that the operations of the method 200 may be rearranged or otherwise modified within the scope of the various aspects. It should be further noted that additional processes may be provided before, during, and after the method 200, and that some other processes may be only briefly described herein. Thus, other implementations are possible within the scope of the various aspects described herein.

Figure 8A:
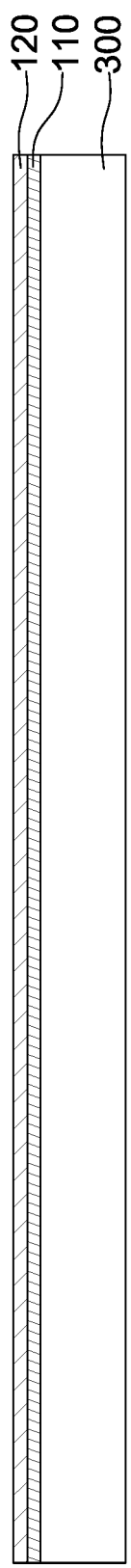
FIGS. 8A to 8H are schematic drawings illustrating stages of a method for forming a package semiconductor structure according to aspects of the present disclosure.
Figure 9A:
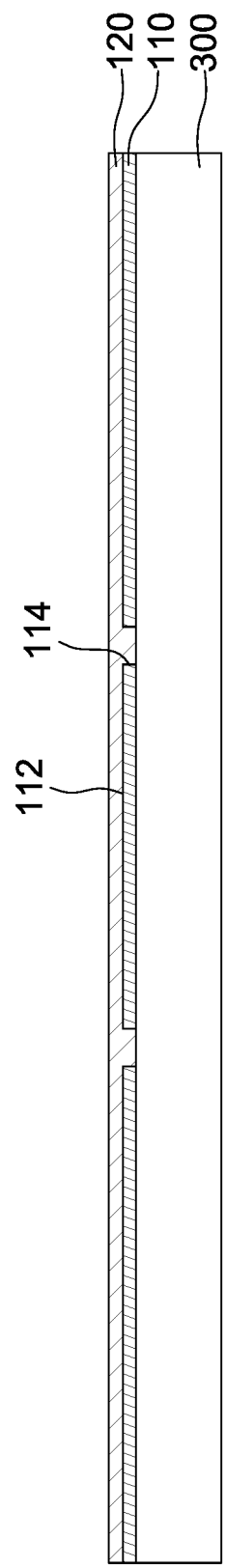
FIGS. 9A to 9H are schematic drawings illustrating stages of a method for forming a package semiconductor structure according to aspects of the present disclosure.

Referring to FIGS. 8A and 9A, in some embodiments, a metal base layer 110 is formed on a carrier 300 in operation 201. In some embodiments, the carrier 300 is received, and a release layer (not shown) may be formed on the carrier 300. In such embodiments, the metal base layer 110 may be formed on the carrier 300 or formed on the release layer. The carrier substrate 300 may be a glass carrier substrate, a ceramic carrier substrate, or the like. The release layer may be formed of a polymer-based material, which may be removed, along with the carrier substrate 300, from the overlying structure, which will be formed in subsequent operations. In some embodiments, the release layer may lose its adhesive property when heated, such as a light-to-heat-conversion (LTHC) release coating. In some embodiments, the release layer may be an ultra violet (UV) glue, which may be disposed as a liquid and cured, may be a film laminated onto the carrier substrate 300, or the like. In some embodiments, the metal base layer 110 may be a continuous layer as shown in FIG. 8A. In some alternative embodiments, the metal base layer 110 can be a discontinuous layer as shown in FIG. 9A, which include a plurality of segments 112 separated with a plurality of intervals 114.

At operation 202, a dielectric material is applied onto the metal base layer 110 to form a connection layer 120. In some embodiments, the connection layer 120 is formed by any suitable deposition process, such as spin coating, chemical vapor deposition (CVD), laminating, the like, or a combination thereof. As shown in FIG. 9A, the intervals 114 of the metal base layer 110 are filled with the dielectric material, so that the segments 112 of the metal base layer 110 are separated by the dielectric material.

Figure 8B:
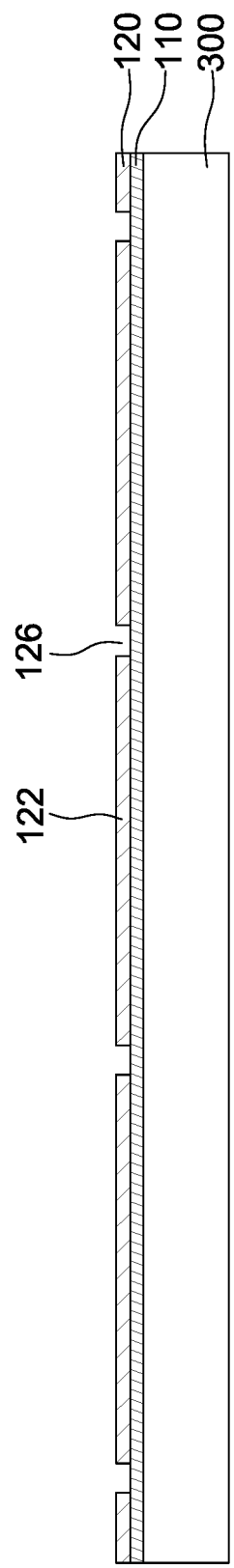
Figure 9B:
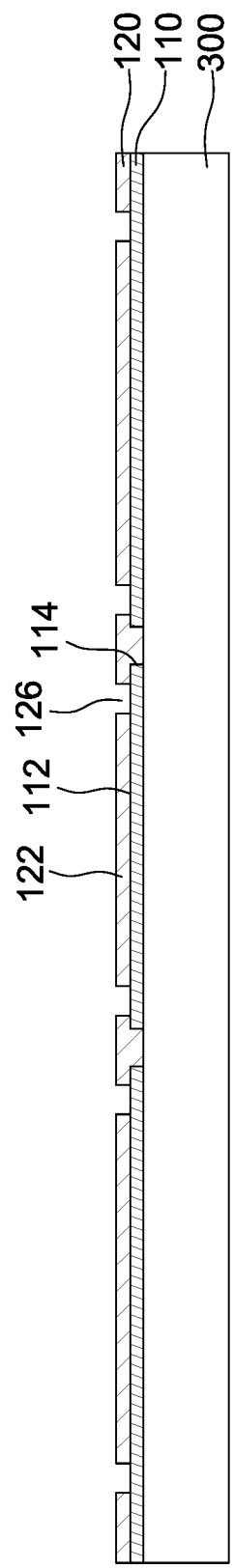

As shown in FIGS. 8B and 9B, at operation 203, a plurality of via openings 126 are formed in the connection layer 120 by removing a portion of the dielectric material to expose the metal base layer 110 underneath the connection layer 120 from the via openings 126 between dielectric layers 122.

Figure 8C:
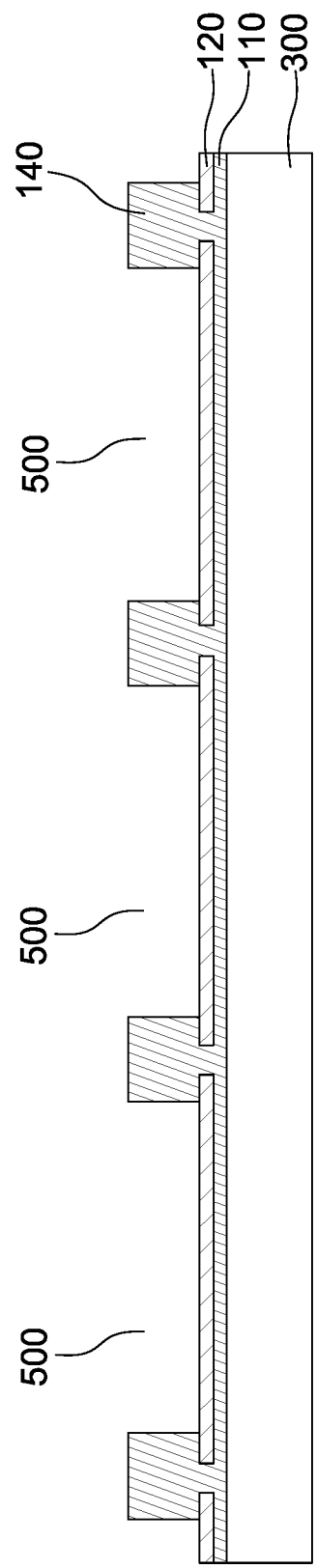
Figure 9C:
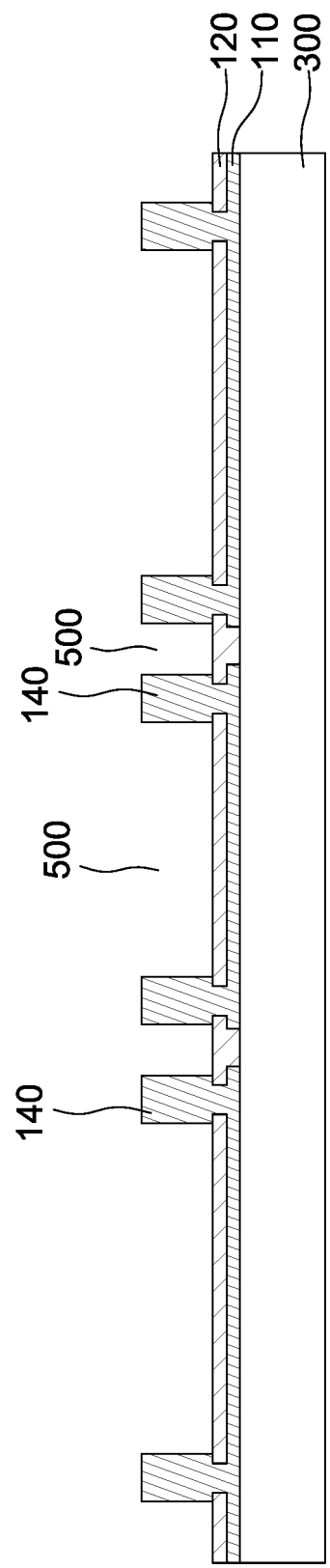

At operation 204, in some embodiments, a seed layer (not shown) is formed over the connection layer 120. The seed layer may be a metal layer. The seed layer may be a single-layered structure or a multi-layered structure. For example, the seed layer may include a Ti sublayer and a Cu sublayer over the Ti sublayer. A patterned photoresist may be formed on the seed layer. The patterned photoresist includes openings that expose portions of the seed layer. A conductive material is then formed in the opening of the patterned photoresist on the exposed portions of the seed layer. In some embodiments, the conductive material may be formed by plating, such as electroless plating, or the like. In some embodiments, after the forming of the conductive material, the patterned photoresist and portions of the seed layer on which no conductive material is formed are removed. Accordingly, the via openings 126 are filled with the conductive material to form a plurality of connecting vias 124 and metal pillars 140 are obtained as shown in FIGS. 8C and 9C. In some embodiments, the metal pillars 140 are coupled to the metal base layer 110 through the connecting vias 124. The metal pillar 140 may be referred to as through molding vias (TMVs) or through insulator vias (TIVs).

Figure 8D:
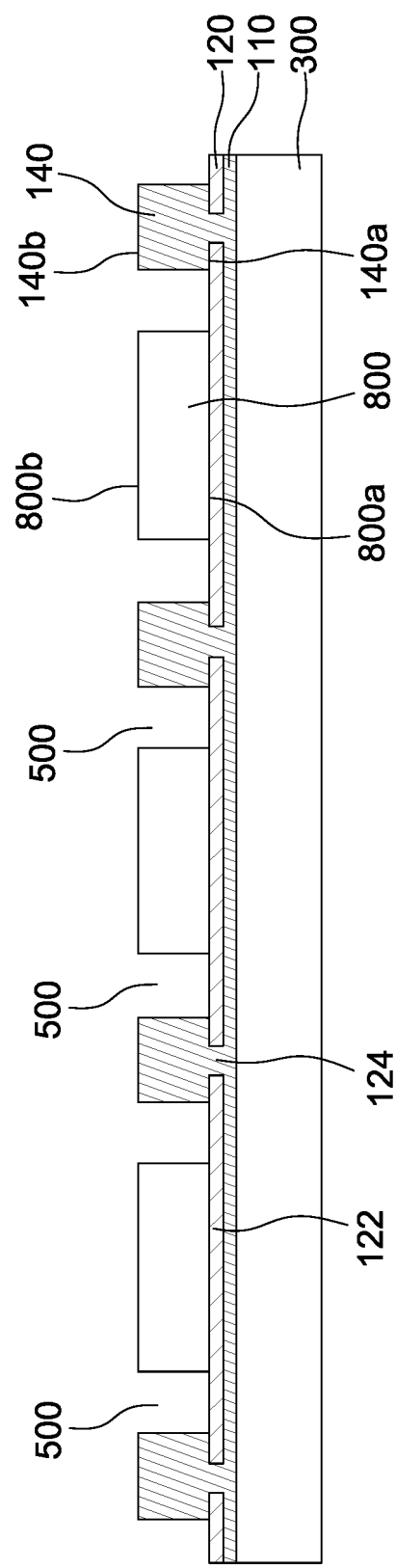
Figure 9D:
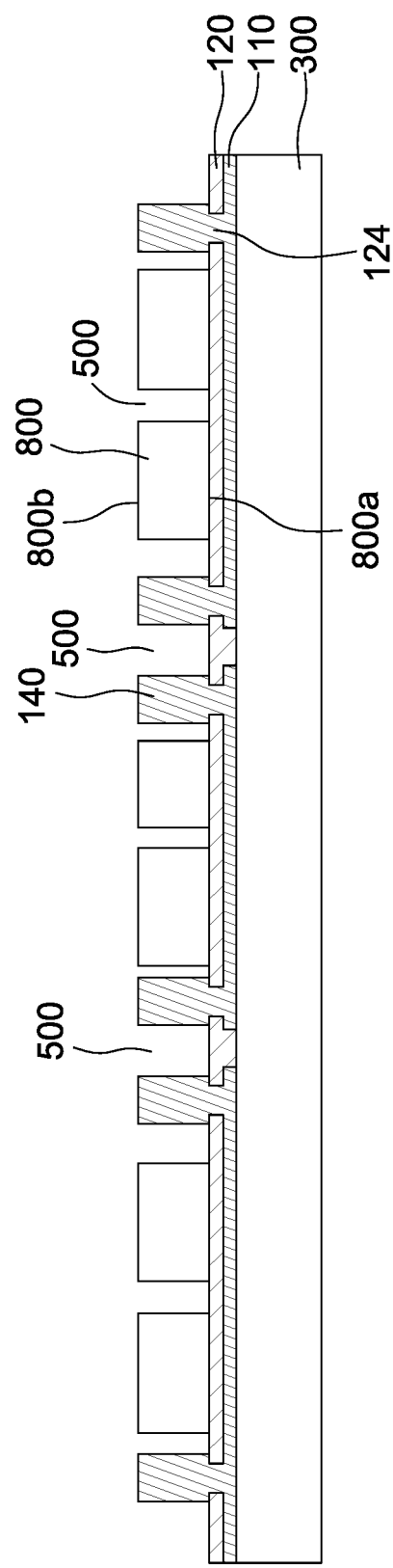

At operation 205, with reference to FIGS. 8D and 9D, some of the at least one recess 500 serve as compartments for accommodating dies 800. One die 800 is attached to the bottom of one of compartments.

Figure 8E:
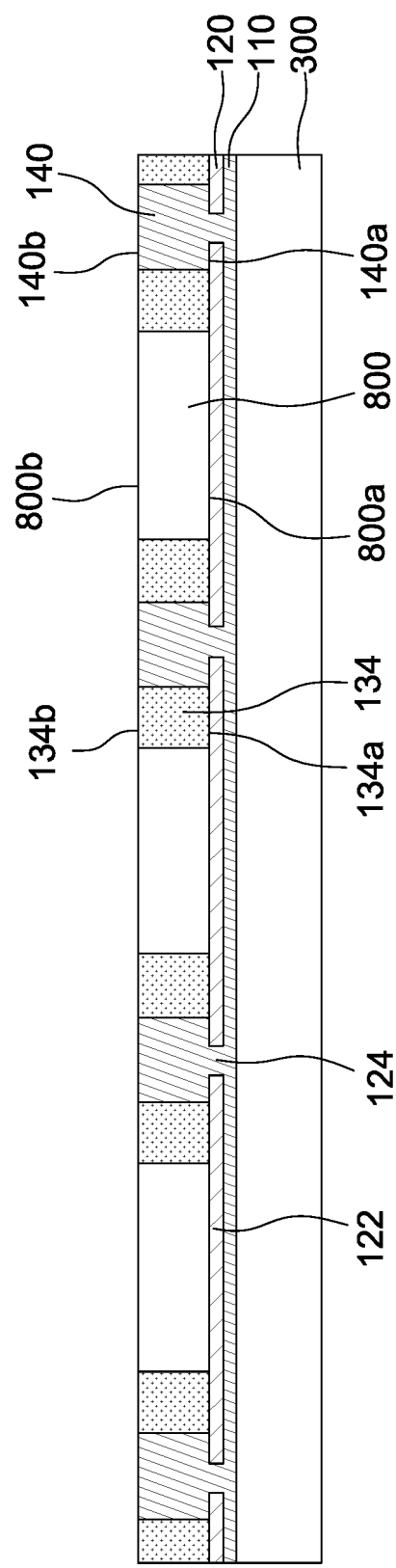
Figure 9E:
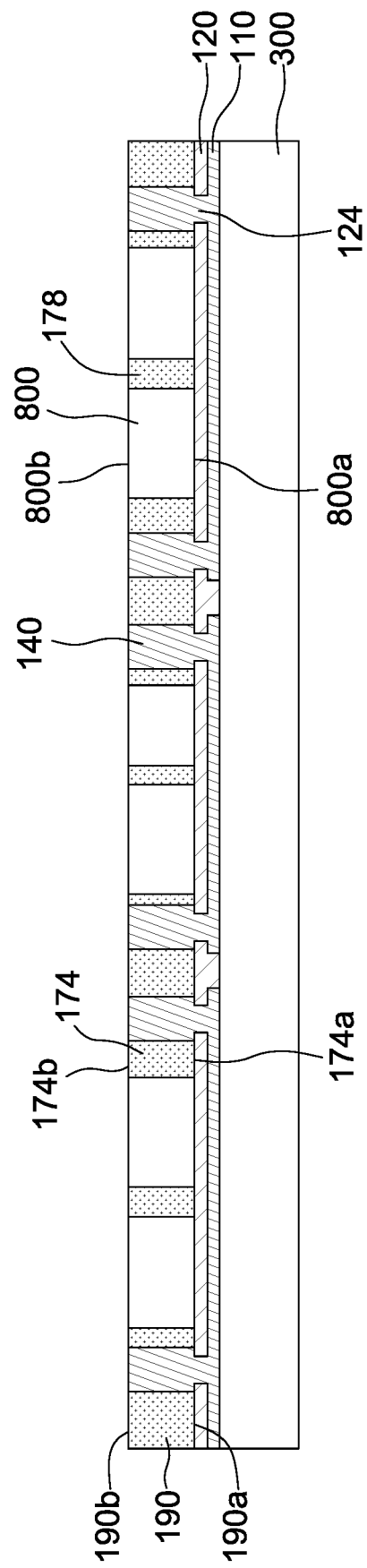

At operation 206, with reference to FIGS. 8E and 9E, a molding material is filled in the recess 500 so as to fill the remaining area of the recess 500 without being occupied by the die 800. In some embodiments, filling the molding material in the recess 500 may include applying a molding material in the recess 500 and over the metal pillar 140 and the die 800; and performing a grinding operation to expose second die surface 800b of the die 800 and the second pillar surface 140b of the metal pillar 140. In some embodiments, as shown in FIG. 8E, a molding structure 134 can be formed from the molding material in the recess 500 and has a first molding surface 134a and a second molding surface 134b opposite to the first molding surface 134a. The first molding surface 134a abuts the dielectric layer 122 of the connection layer 120 and is substantially aligned with (i.e., coplanar with) the first die surface 800a. The second die surface 800b of the die 800, the second pillar surface 140b of the metal pillar 140 and the second molding surface 134b of the molding structure 134 are aligned with (i.e., coplanar with) each other after the grinding, in some embodiments, as shown in FIG. 9E, an inner molding structure 174 can be formed by the molding material in the recess 500 to surround the die 800 and an outer molding structure 190 can be formed by the molding material in the recess 500 disposed between the metal pillars 140. An outer molding top 190b of the outer molding structure 190 and a second molding surface 174b of the inner molding structure 174 may be substantially aligned with (i.e., coplanar with) the second die surface 800b and the second pillar surface 140b.

Figure 8F:
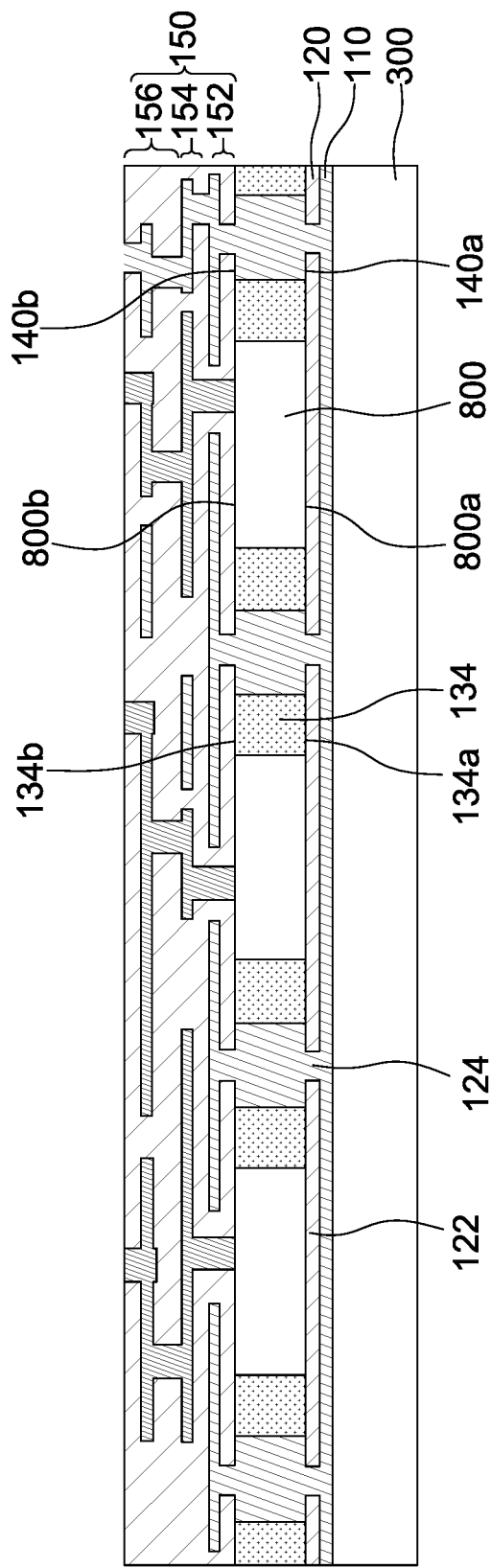
Figure 9F:
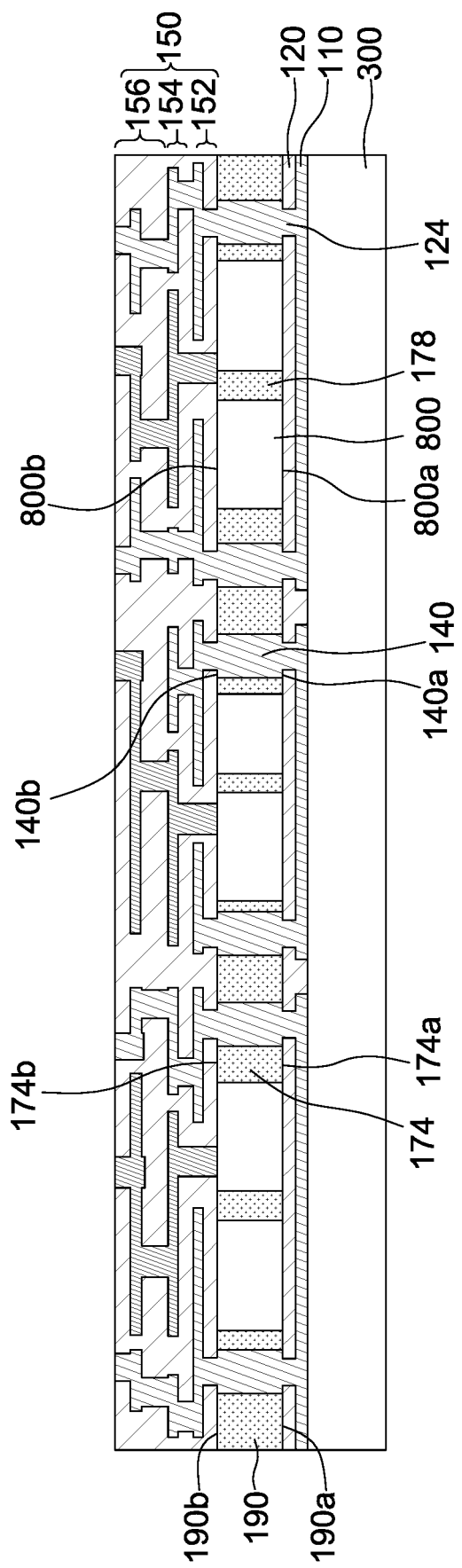

Referring to FIGS. 8F and 9F, in some embodiments, an interconnect structure 150 is formed over the on the die 800, a molding material and the metal pillar 140 in operation 207. The interconnect structure 150 may be referred to as a redistribution layer (RDL). The formation of the interconnect structure 150 includes forming a first interconnect layer 152, a second interconnect layer 154 and at least one overlying interconnect layer 156. Forming the first interconnect layer 152 includes applying a first dielectric layer 152a over the die 800, a molding material and the metal pillar 140 and forming at least one first metal layer 152b and at least one first metal connection 152c through, for example, dual damascene. Forming the second interconnect layer 154 includes applying a second dielectric layer 154a over the first interconnect layer 152 and forming at least one second metal layer 154b and at least one second metal connection 154c through, for example, dual damascene. Forming the overlying interconnect layer 156 includes applying an overlying dielectric layer 156a over the second interconnect layer 154 and forming at least one overlying metal layer 156b and at least one overlying metal connection 156c through, for example, dual damascene. The overlying metal connections 156c can connect the overlying metal layer 156b with the first metal connection 152c, the second metal connection 154c or both of the first metal connection 152c and the second metal connection 154c.

As shown in FIG. 8F, the first metal connection 152c may connect the first metal layer 152b with the metal pillar 140. In some embodiments, the first metal connection 152c may connect the first metal layer 152b with the die 800 in the die unit 130. In some embodiments, some of the first metal connections 152c connect some first metal layers 152b with the metal pillar 140 and some of the first metal connections 152c connect the other with the dies 800 in the die units 130.

In some embodiments, the second metal connection 154c may connect the second metal layer 154b with the metal pillar 140. In some embodiments, some of the second metal connections 154c connect some second metal layers 154b with the metal pillar 140, some of the second metal connections 154c connect the other with the dies 800 in the die units 130 and/or some of the second metal connections 154c connect some second metal layers 154b with the first metal layers 152b.

As shown in FIG. 9F, the first metal connection 152c may connect the first metal layer 152b with the metal pillar 140. In some embodiments, the first metal connection 152c may connect the first metal layer 152b with the die 800. In some embodiments, some of the first metal connections 152c connect some first metal layers 152b with the metal pillar 140 and some of the first metal connections 152c connect the other first metal layers 152b with the dies 800. The second metal connection 154c may connect the second metal layer 154b with a die 800. In some embodiments, the second metal connection 154c may connect the second metal layer 154b with the metal pillar 140. In some embodiments, some of the second metal connections 154c connect some second metal layers 154b with the metal pillar 140, some of the second metal connections 154c connect some second metal layers 154b with the dies 800 and/or some of the second metal connections 154c connect some second metal layers 154b with the first metal layers 152b.

Figure 8G:
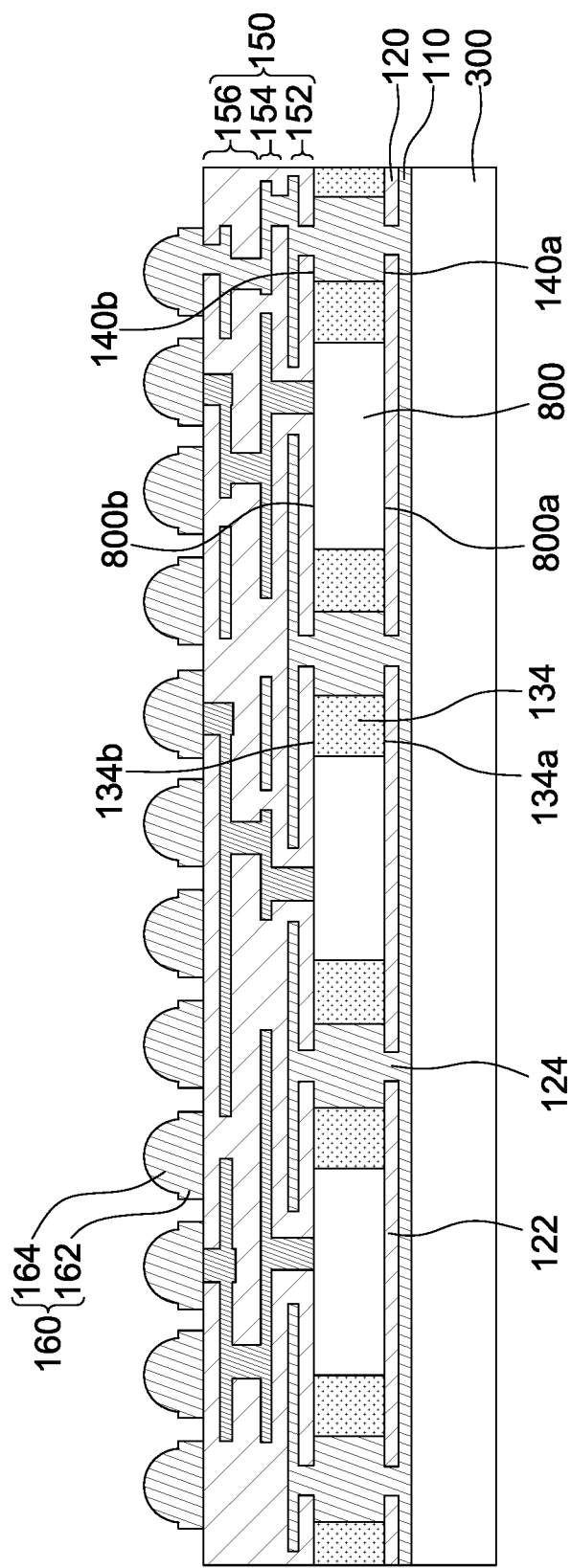
Figure 9G:
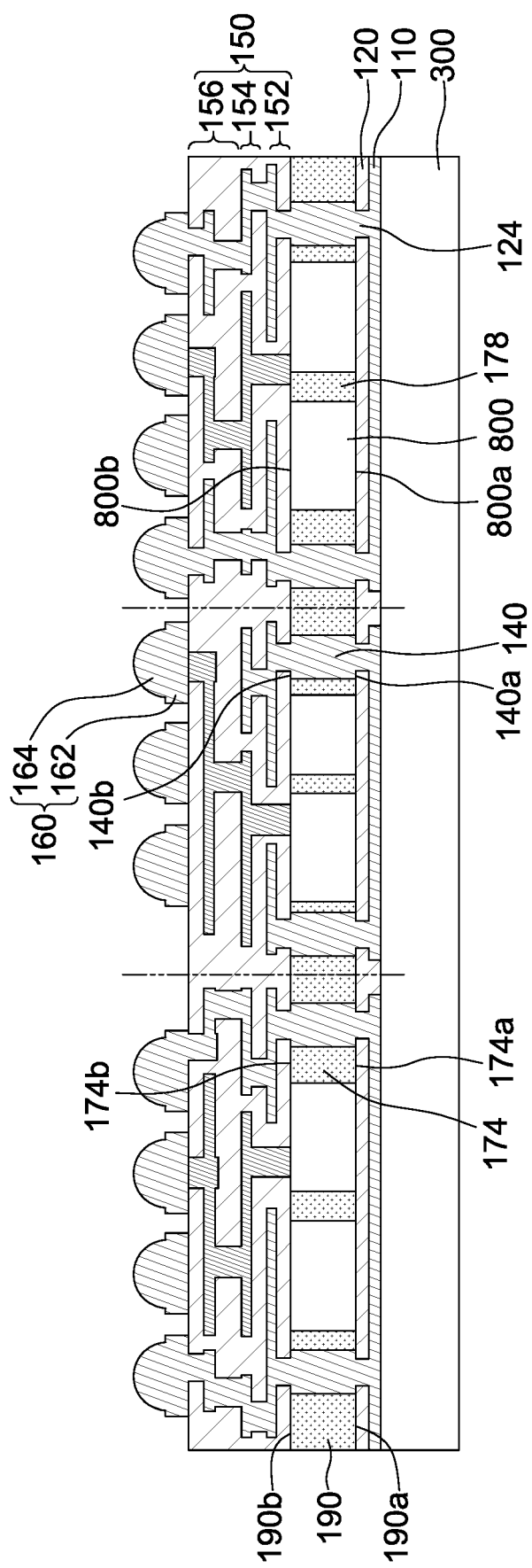

Referring to FIGS. 8G and 9G, in some embodiments, a plurality of external connectors 160 can be formed over the interconnect structure 150 and connect the overlying metal layer 156b through overlying metal connections 156d. The external connectors 160 can be formed on an exterior side of the interconnect structure 150. In some embodiments, each external connector 160 includes a pad 162 and a conductive connector 164 over the pad 162.

Figure 8H:
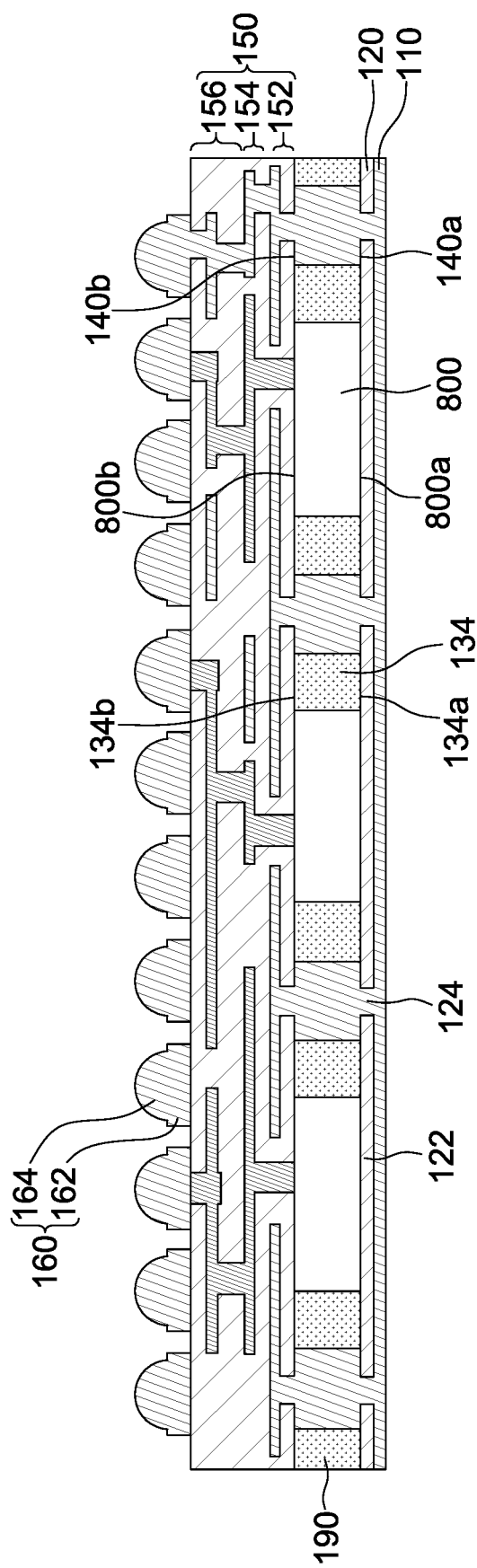
Figure 9H:
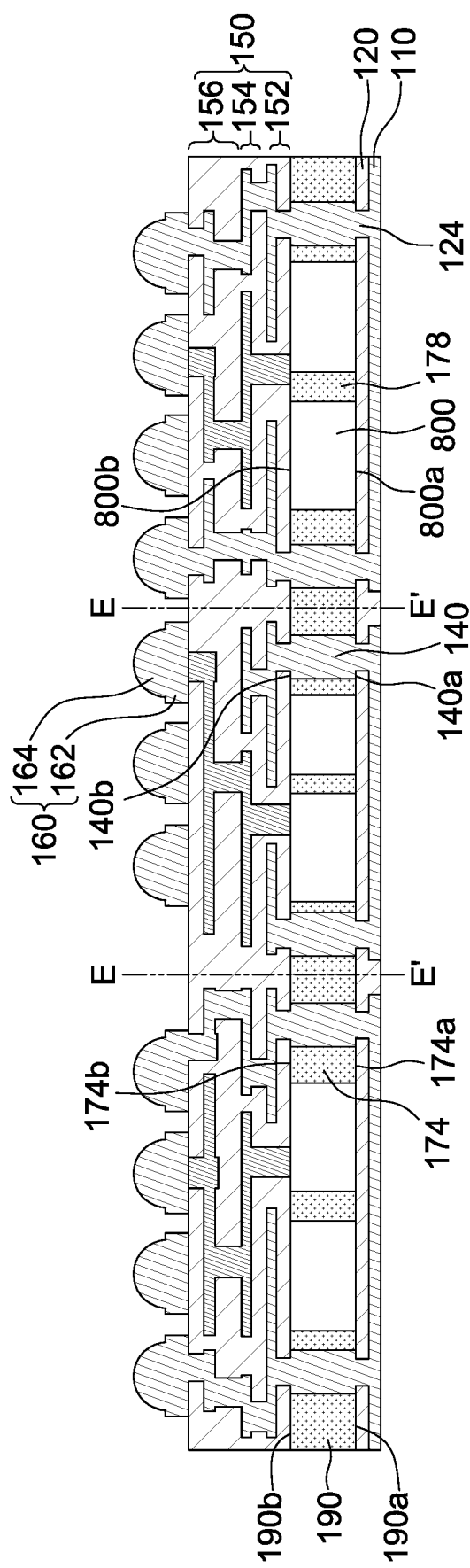

With reference to FIGS. 8H and 9H, the method can further include removing the carrier 300 and cutting the semiconductor package structure as demand. For example, as shown in FIGS. 4 and 9H, the semiconductor package structure may be cut along the E-E' lines, so that a final package structure may include four dies arranged in an array with two rows and each row has two columns (i.e., 2×2 dies), but the disclosure is not limited thereto.

The present disclosure therefore provides a semiconductor package structure including at least one die surrounded by the metal base layer 110 (serving as a bottom shielding), the metal pillar 140 (serving as a sidewall shielding) and interconnect structure 150 (serving as a top shielding). Unlike an external conductive shielding lid, the EMI shielings of the present invention reduce area penalty. Furthermore, the formation of these shielings can be completed during the manufacture of the semiconductor package structure, so no extra process is needed and no conductive adhesive is required.

According to one embodiment of the present disclosure, a semiconductor package structure includes a metal base layer; a connection layer formed on the metal base layer; at least one die unit formed on the connection layer, each die unit comprising at least one die attached onto the connection layer and surrounded by a molding structure; a metal pillar connecting the metal base layer and surrounding the die unit; an interconnect structure overlaid onto the die unit and the metal pillar, and including a first interconnect layer including a first dielectric layer overlaid onto the die unit and the metal pillar; at least one first metal layer formed in the first dielectric layer and being parallel with the top surface of the die unit; and at least one first metal connection connecting the first metal layer with the metal pillar; and a second interconnect layer formed on the first interconnect layer and including a second dielectric layer, at least one second metal layer formed in the second dielectric layer and being parallel with the top surface of the die unit; and at least one second metal connection connecting the second metal layer with the die in the die unit; and wherein a projection of the first metal layer and the second metal layer overlaps an upper surface of the die.

According to one embodiment of the present disclosure, a semiconductor package structure includes a metal base layer; a connection layer formed on the metal base layer; a die array disposed on the connection layer and including a plurality of compartments separated by an insulating structure and each compartment accommodating a die; and an inner molding structure surrounding the compartments and serving as a sidewall of the die array; a metal pillar connecting the metal base layer and surrounding the inner molding structure; an outer molding structure surrounding the metal pillar; and an interconnect structure formed on the die array, the metal pillar and the outer molding structure and connecting to the die and the metal pillar.

According to one embodiment of the present disclosure, a method for forming a semiconductor package structure includes forming a metal base layer on a carrier; applying a connection layer on the metal base layer; forming a plurality of via openings in the connection layer to expose the metal base layer underneath the connection layer; forming metal pillars on the connection layer with at least one recess between the metal pillars, so that the recess has the connection layer as a bottom and the metal pillar as a sidewall; attaching a die to the bottom of one of the at least one recess; filling molding materials in the recess; and stacking an interconnect structure on the die, the molding materials and the metal pillar, so that the interconnect structure electrically connects to the die and the metal pillar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor package structure, comprising:
a metal base layer;
a connection layer formed on the metal base layer and comprising a plurality of dielectric layers arranged at a same level and a connecting via;
a die array disposed on one of the plurality of dielectric layers of the connection layer and comprising:
a plurality of dies;
a plurality of compartments separated by an insulating structure and each compartment accommodating one die of the plurality of dies; and
an inner molding structure surrounding the compartments and serving as a sidewall of the die array;
a metal pillar connecting the metal base layer through the connecting via and surrounding the inner molding structure;

an outer molding structure formed on one of the plurality of dielectric layers of the connection layer and surrounding the metal pillar; and an interconnect structure formed on the die array, the metal pillar and the outer molding structure and connecting to the plurality of dies and the metal pillar.

2. The semiconductor package structure of claim 1, wherein the interconnect structure comprises a first interconnect layer and a second interconnect layer, wherein the first interconnect layer is disposed on the die array, the metal pillar and the outer molding structure and comprises:

a first dielectric layer overlaid onto the die array, the metal pillar and the outer molding structure, at least one first metal layer formed in the first dielectric layer and being parallel with an upper surface of the die; and at least one first metal connection connecting the at least one first metal layer with the metal pillar;

wherein the second interconnect layer stacks on the first interconnect layer and comprises:

a second dielectric layer overlaid onto the at least one first metal layer, at least one second metal layer formed in the second dielectric layer and being parallel with the upper surface of the die; and at least one second metal connection connecting the at least one second metal layer with a die of the die array; and wherein a projection of the at least one first metal layer and a projection of the at least one second metal layer overlap the upper surface of the die.

3. The semiconductor package structure of claim 2, wherein the projection of the at least one first metal layer overlaps the upper surface of the die by about 50% or more.

4. The semiconductor package structure of claim 2, wherein the projection of the at least one second metal layer overlaps the upper surface of the die by about 50% or more.

5. The semiconductor package structure of claim 2, wherein the interconnect structure further comprises at least one overlying interconnect layer stacking on the second interconnect layer and comprising:

an overlying dielectric layer overlaid onto the second interconnect layer;

at least one overlying metal layer formed in the overlying dielectric layer and being parallel with the upper surface of the die; and at least one overlying metal connection connecting the overlying metal layer with the at least one first metal layer, the second at least one metal layer or a combination thereof.

6. The semiconductor package structure of claim 1, further comprising a plurality of external connectors connecting the interconnect structure.

7. The semiconductor package structure of claim 2, wherein the at least one second metal layer further connects to the metal pillar through the second metal connection.

8. The semiconductor package structure of claim 1, wherein the metal base layer comprises a first conductive material;
the connecting vias comprises a second conductive material;
the metal pillar comprises a third conductive material;

wherein the first conductive material, the second conductive material and the third conductive material are identical.

9. A semiconductor package structure, comprising:

a metal base layer;

a connection layer formed on the metal base layer and comprising a plurality of dielectric layers arranged at a same level and a connecting via;

a die array disposed on one of the plurality of dielectric layers of the connection layer and comprising:

a plurality of dies, each of the plurality of dies having a first die surface abutting the connection layer and a second die surface opposite to the first die surface;

a plurality of compartments separated by an insulating structure and each compartment accommodating one die of the plurality of compartments; and an inner molding structure surrounding the compartments and serving as a sidewall of the die array, wherein the inner molding structure has a first molding surface abutting the connection layer and aligned with the first die surface, and a second molding surface opposite to the first molding surface;

a metal pillar connecting the metal base layer through the connecting via and surrounding the inner molding structure, wherein the metal pillar comprises a first pillar surface aligned with the first die surface and the first molding surface and a second pillar surface opposite to the first pillar surface;

an outer molding structure formed on one of the plurality of dielectric layers of the connection layer and surrounding the metal pillar; and an interconnect structure formed on the die array, the metal pillar and the outer molding structure and connecting to the plurality of dies and the metal pillar.

10. The semiconductor package structure of claim 9, wherein the interconnect structure comprises a first interconnect layer and a second interconnect layer, wherein the first interconnect layer is disposed on the die array, the metal pillar and the outer molding structure, and comprises:

a first dielectric layer overlaid onto the die array, the metal pillar and the outer molding structure;

at least one first metal layer formed in the first dielectric layer and being parallel with an upper surface of the die; and at least one first metal connection connecting the at least one first metal layer with the metal pillar;

wherein the second interconnect layer stacks on the first interconnect layer and comprises:

a second dielectric layer overlaid onto the at least one first metal layer;

at least one second metal layer formed in the second dielectric layer and being parallel with the upper surface of the die; and at least one second metal connection connecting the at least one second metal layer with a die of the die array, wherein a projection of the at least one first metal layer and a projection of the at least one second metal layer overlap an upper surface of the die.

11. The semiconductor package structure of claim 10, wherein the interconnect structure further comprises at least one overlying interconnect layer stacking on the second interconnect layer and comprising:

an overlying dielectric layer overlaid onto the second interconnect layer;

at least one overlying metal layer formed in the overlying dielectric layer and being parallel with the upper surface of the die; and at least one overlying metal connection connecting the overlying metal layer with the at least one first metal layer, the at least one second metal layer or a combination thereof.

12. The semiconductor package structure of claim 9, further comprising a plurality of external connectors connecting the interconnect structure.

13. The semiconductor package structure of claim 10, wherein the at least one second metal layer further connects to the metal pillar through the second metal connection.

14. The semiconductor package structure of claim 9, wherein the metal base layer comprises a first conductive material;
the connecting vias comprises a second conductive material;
the metal pillar comprises a third conductive material;
wherein the first conductive material, the second conductive material and the third conductive material are identical.

15. A semiconductor package structure, comprising:
a metal base layer;
a connection layer formed on the metal base layer and comprising a plurality of dielectric layers arranged at a same level and a connecting via;
a die array disposed on one of the plurality of dielectric layers of the connection layer and comprising:
a plurality of dies;
four compartments arranged in an array with two rows and each row including two columns and the compartments separated by an insulating structure and each compartment accommodating one die of the plurality of dies; and
an inner molding structure surrounding the compartments and serving as a sidewall of the die array;
a metal pillar connecting the metal base layer through the connecting via and surrounding the inner molding structure;
an outer molding structure formed on one of the plurality of dielectric layers of the connection layer and surrounding the metal pillar; and
an interconnect structure formed on the die array, the metal pillar and the outer molding structure, and connecting to the plurality of die and the metal pillar;
wherein a thickness of the outer molding structure is the same as a thickness of the inner molding structure, is the same as a thickness of the metal pillar and is also the same as a thickness of the die.

16. The semiconductor package structure of claim 15, wherein the interconnect structure comprises a first interconnect layer and a second interconnect layer, wherein the first interconnect layer is disposed on the die array, the metal pillar and the outer molding structure and comprises:
a first dielectric layer overlaid onto the die array, the metal pillar and the outer molding structure;
at least one first metal layer formed in the first dielectric layer and being parallel with an upper surface of the die; and
at least one first metal connection connecting the at least one first metal layer with the metal pillar;
wherein the second interconnect layer stacks on the first interconnect layer and comprises:
a second dielectric layer overlaid onto the at least one first metal layer;
at least one second metal layer formed in the second dielectric layer and being parallel with the upper surface of the die; and
at least one second metal connection connecting the at least one second metal layer with the plurality of dies of the die array; and
wherein a projection of the at least one first metal layer and a projection of the at least one second metal layer overlap the upper surface of the die.

17. The semiconductor package structure of claim 16, wherein the projection of the at least one first metal layer overlaps the upper surface of the die by about 50% or more; and the projection of the at least one second metal layer overlaps the upper surface of the die by about 50% or more.

18. The semiconductor package structure of claim 16, wherein the interconnect structure further comprises at least one overlying interconnect layer stacking on the second interconnect layer and comprising:
an overlying dielectric layer overlaid onto the second interconnect layer;
at least one overlying metal layer formed in the overlying dielectric layer and being parallel with the upper surface of the die; and
at least one overlying metal connection connecting the overlying metal layer with the at least one first metal layer, the at least one second metal layer or a combination thereof.

19. The semiconductor package structure of claim 16, wherein the at least one second metal layer further connects to the metal pillar through the second metal connection.

20. The semiconductor package structure of claim 15, wherein metal base layer comprises a first conductive material;
the connecting vias comprises a second conductive material;
the metal pillar comprises a third conductive material;
wherein the first conductive material, the second conductive material and the third conductive material are identical.

* * * * *